(12) United States Patent
Hultmark

(10) Patent No.: US 6,171,458 B1
(45) Date of Patent: Jan. 9, 2001

(54) METHOD FOR MANUFACTURING AN ABSORBENT LAYER FOR SOLAR COLLECTORS, A DEVICE FOR PERFORMING THE METHOD AND AN ABSORBENT LAYER FOR SOLAR COLLECTORS

(75) Inventor: Göran Hultmark, Västra Frölunda (SE)

(73) Assignee: Sunstrip AB (SE)

( * ) Notice: Under 35 U.S.C. 154(b), the term of this patent shall be extended for 0 days.

(21) Appl. No.: 09/265,495

(22) Filed: Mar. 10, 1999

Related U.S. Application Data

(63) Continuation of application No. PCT/SE97/01545, filed on Sep. 5, 1997.

(51) Int. Cl.$^7$ ............................ C23C 14/08; C23C 14/56; C23C 14/35; F24J 2/48
(52) U.S. Cl. ............................. 204/192.28; 204/192.15; 204/192.12; 204/192.26; 204/192.29; 204/298.02; 204/298.07; 204/298.08; 204/298.13; 204/298.19; 204/298.24; 204/298.26; 136/256; 136/259; 136/243; 136/244
(58) Field of Search ................... 204/192.15, 192.12, 204/192.26, 192.28, 192.29, 298.02, 298.07, 298.08, 298.13, 298.19, 298.24, 298.26; 136/256, 259, 243, 244

(56) References Cited

U.S. PATENT DOCUMENTS

| 4,441,974 |   | 4/1984  | Nishikawa et al. ............. 204/192.12 |
| 4,661,229 | * | 4/1987  | Hemming et al. ............... 204/192.29 |
| 4,885,070 | * | 12/1989 | Campbell et al. ............... 204/192.11 |
| 5,108,571 | * | 4/1992  | Ludwig et al. .................. 204/192.13 |
| 5,135,581 | * | 8/1992  | Tran et al. ........................... 136/256 |
| 5,993,622 | * | 11/1999 | Szczyrbowski et al. ........ 204/298.24 |

FOREIGN PATENT DOCUMENTS

| 3022714     |   | 3/1982  | (DE) . |
| 2079323     | * | 1/1982  | (GB) . |
| 57-13172    |   | 1/1982  | (JP) . |
| 07110401    |   | 4/1995  | (JP) . |
| WO 87/06626 |   | 11/1987 | (WO) . |
| WO 92/14860 |   | 9/1992  | (WO) . |

OTHER PUBLICATIONS

International Search Report dated Jan. 16, 1998.
English abstract for JP 59–69658(A), Apr. 1984.

\* cited by examiner

*Primary Examiner*—Alan Diamond
(74) *Attorney, Agent, or Firm*—Klarquist Sparkman Campbell Leigh & Whinston, LLP

(57) ABSTRACT

A spectral selective absorbing surface on solar collector elements has a very high solar absorbing ability, in the range of 96% to 97% and a low thermal emittance, in the order of 10%, and can be produced with high capacity in industrial scale. A reactive gas in an amount of 1 to 50 cm$^3$/min kW, preferably 10 cm$^3$/min kW, distributed in the coating zone provides that the metal layer deposited onto the receiving material partly oxidizes during the deposition, whereby a layer is obtained that comprises a grain mixture of metallic material and metal oxide, whereby 40% to 80%, preferably about 50%, of metallic material is embedded into the metal oxide closest to the receiving material. The metallic material is successively decreased to about zero at the surface of the layer by increasing the addition of oxygen at the end of the coating zone. The metal is selected from the group consisting of nickel, chromium, cobalt, molybdenum, or the similar, or a mixture thereof, preferably a nickel-chromium-alloy where the ratio of chromium is 4 to 30%, preferably about 20%, and the grain size is <0.005 mm, preferably 0.001 mm.

29 Claims, 5 Drawing Sheets

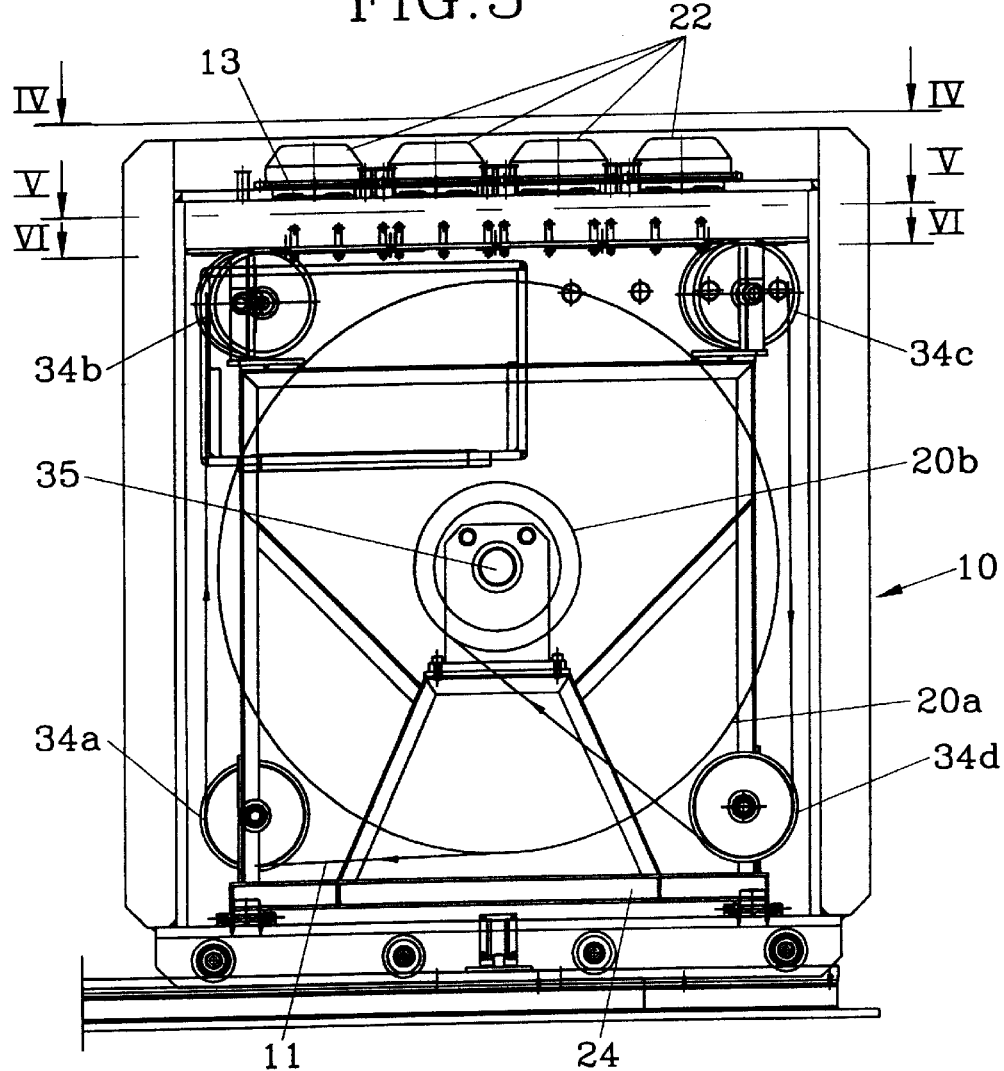
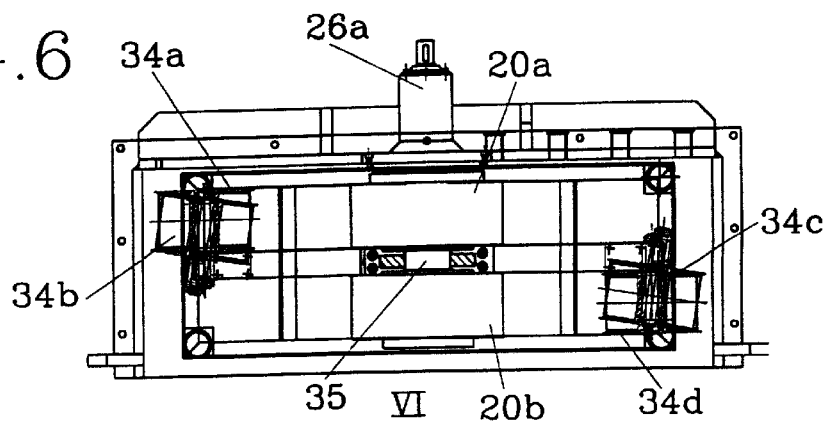

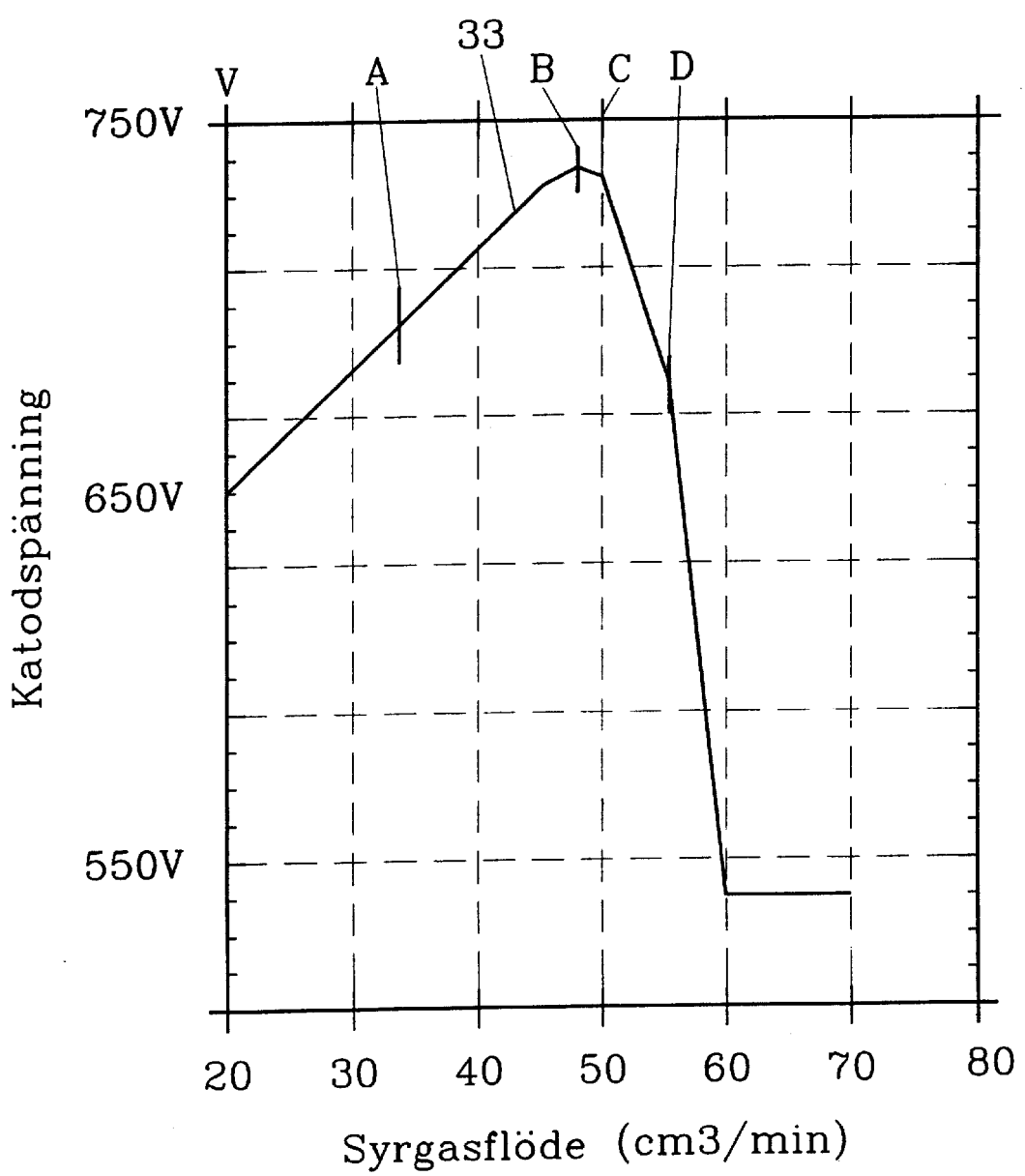

METHOD FOR MANUFACTURING AN ABSORBENT LAYER FOR SOLAR COLLECTORS, A DEVICE FOR PERFORMING THE METHOD AND AN ABSORBENT LAYER FOR SOLAR COLLECTORS

This application is a continuation of PCT International Application No. PCT/SE97/01545, filed Sep. 5, 1997.

The present invention relates to a method and device for manufacturing spectral selectively absorbing layers for solar collectors having a high absorbing ability and low thermal emittance on a movable receiving material by sputtering of metal in a coating zone having a sputtering atmosphere comprising at least one gas supporting the sputtering, preferably argon, (Ar), and a reactive gas, preferably oxygen ($O_2$), whereby the metal constitutes the cathode and the receiving material constitutes the anode, between which a potential difference is obtained and thereby, a plasma, whereby metallisation of the receiving material is obtained by sputtering.

BACKGROUND OF THE INVENTION

Solar collectors having a high energy efficiency absorb the solar radiation falling in thereon, transform it to heat energy, and deliver the thermal energy to a heat exchanging medium with least possible losses.

The most critical part of a solar collector having high energy efficiency is its absorbing surface, which has to be spectral selective, i.e. have the ability of absorbing radiation in the wave length range of 0.3 to 2.5 micrometer where the substantial part of the solar radiation energy is present. It shall further posses a low thermal emittance in the wave length range of 4.0 to 50 micrometer.

A number of methods are known to obtain reflecting surfaces on e.g. A solar collector, viz., anodization with a subsequent metal pigmentation and sputtering or atomizing.

Sputtering is obtained by means of having the cathode bombed by ions in a plasma gas formed by a potential difference between the cathode and the receiving material, whereby the cathode material is being atomized and the material forms a coating upon the receiving material. The process takes place in a vacuum chamber.

Solar energy absorbing means are known from SE-C-7713121-7, which means comprises a sheet formed element of aluminum sheet and a surface layer applied upon this by means of anodizing, surface layer has a high spectral selectivity and which consists of an aluminum oxide layer having been tightened afterwards and having a maximum thickness of 1.5 micrometer. The surface layer comprises small pores comprising metal, which layer is completely included into the oxide layer and are isolated from each other. The manufacture of the absorbing surface takes place using anodization and introduction of metal into the pores in an electrolytic way. This method is carried out in two different process steps and two different metals are used. The methods are labour intense and requires a lot of man power. After the electrolytic treatment a number of environmentally dangerous residual products are produced which have to be safely stored and destructively treated.

Further, from U.S. Pat. No. 4,964,963 there is known a method using two process steps, whereby a solar energy reflector is primarily coated with a stainless steel in an oxidizing atmosphere by atomizing whereupon a second metal layer having a high reflecting ability is atomized above the steel.

From U.S. Pat. No. 4,990,234 and the international application WO 87/06626 there is known different methods for coating glass surfaces with another material, by means of the atomizing technology.

DE-3,022,714-C2 describes a method for the preparation of a selectively absorbing layer for a solar collector using an argon-nitrogen sputtering atmosphere, where nickel is transferred to nickel nitride by means of cathode atomizing. The process provides a surface having high absorption values and a relatively low thermal emittance, but it is not suited for industrial manufacturing as the treatment time (30 min for a treatment surface of 1.6 $m^2$) during the atomizing is far too long.

THE OBJECT OF THE INVENTION AND ITS MOST IMPORTANT FEATURES

The object of the present invention is to obtain a spectral selective absorbing, surface on solar collector elements, which surface has a very high solar absorbing ability, in the range of 96 to 97% and having a low thermal emittance, in the order of 10%, and which can be produced with high capacity in industrial scale. These objectives have been solved by the fact that the reactive gas in an amount of 1 to 50 $cm^3$/min, kW, preferably 10 $cm^3$min, kW and the distribution hereof in the coating zone, provides that the metal layer deposed onto the receiving material partly oxidizes during the deposition, whereby a layer is obtained that comprises a grain mixture of metallic material and metal oxide, whereby 40 to 80%, preferably about 50%, of metallic material is embedded into the metal oxide closest to the receiving material, which metallic material is successively decreased to about zero at the surface of the layer by increasing the addition of oxygen at the end of the coating zone, that the metal is selected from the group consisting of nickel, chromium cobalt, molybdenum, or the similar, or a mixture thereof, preferably a nickel-chromium-alloy where the ratio of chromium is 4 to 30%, preferably about 20%, and that the grain size is <0.005 micrometer, preferably 0.001 micrometer.

By using the method of the invention the man power demand is reduced with about 60%. No environmentally dangerous residual products is produced at the sputtering. The manufacturing time, the manufacturing costs, and material and energy consumption can be reduced.

DESCRIPTION OF THE DRAWINGS

The invention will be described in the following with reference to the exemplifying embodiment shown in the accompanying drawings.

FIG. 3 shows a cross-section of a second exemplifying embodiment of a sputtering plant of the invention.

FIGS. 4–6 show three different cross-sections IV—IV, V—V, and VI—VI of the exemplifying embodiment of FIG. 3.

FIG. 7 shows a graph of the cathode characteristics.

DESCRIPTION OF EXEMPLIFYING EMBODIMENTS

Figure 1:
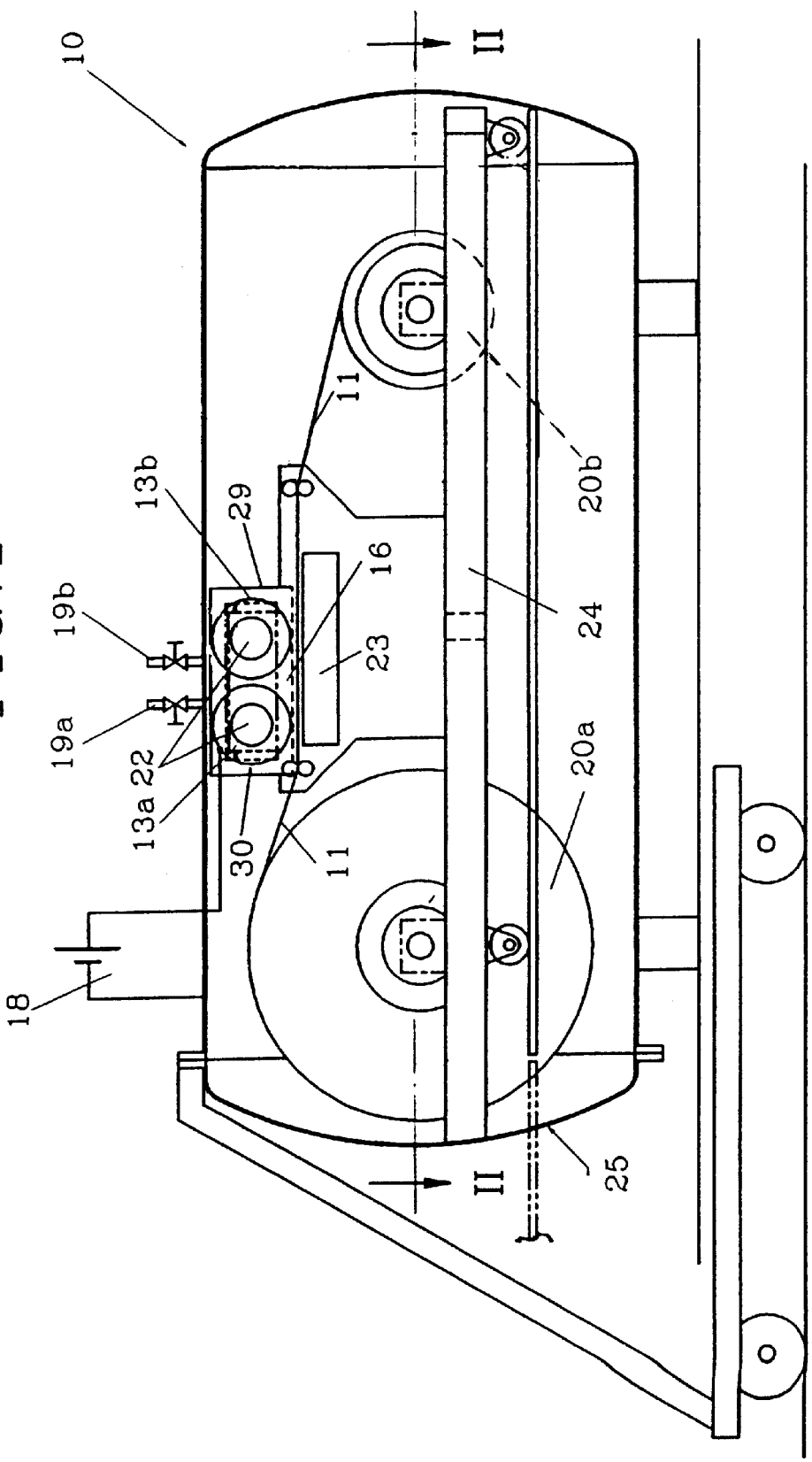
FIG. 1 shows diagrammatically a cross-section of an exemplifying embodiment of a sputtering plant of the invention.
Figure 2:
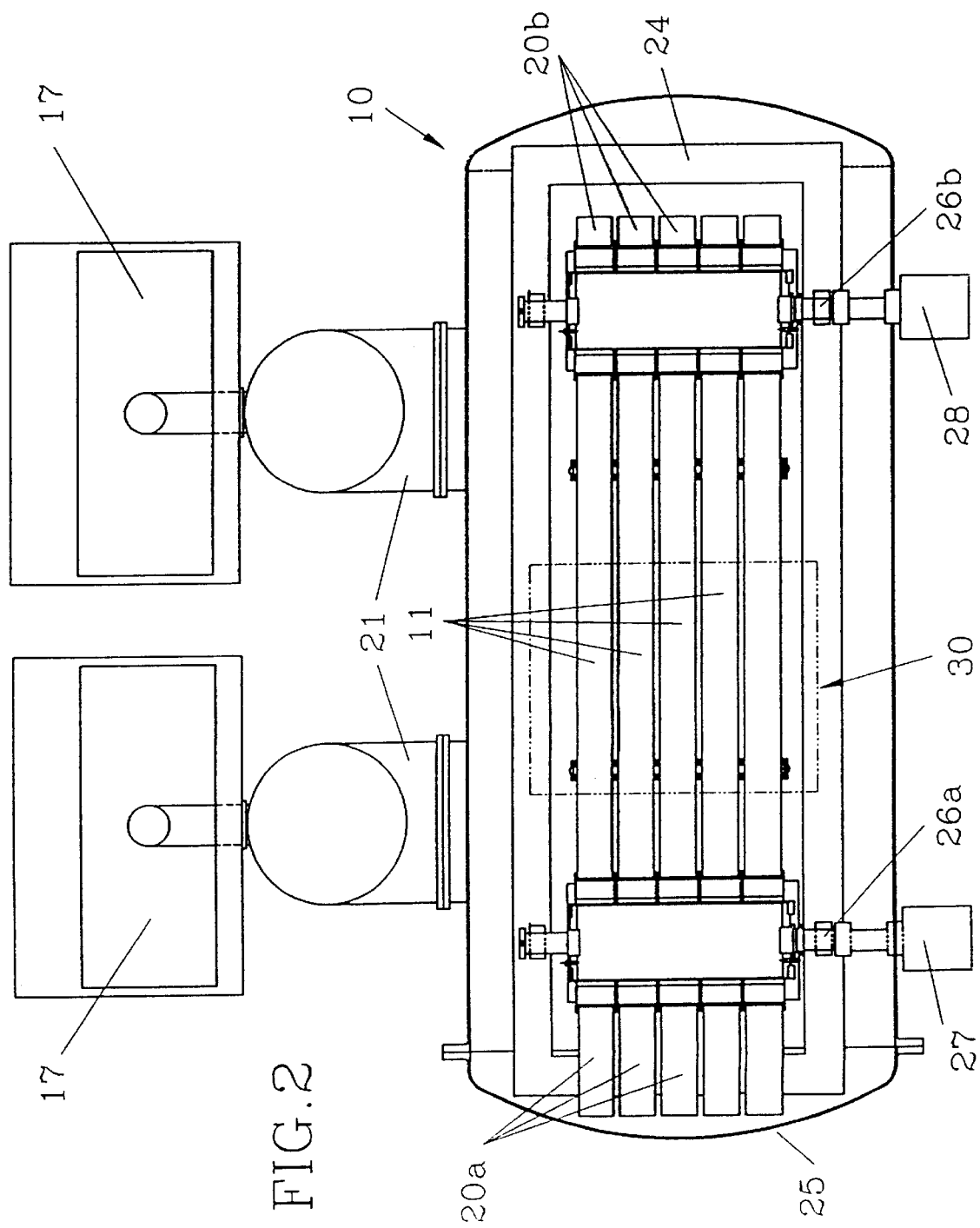
FIG. 2 shows a cross-section along the line 11—11 of FIG. 1.

FIGS. 1 and 2 show a pressure vessel or vacuum container 10 comprising a controlled atmosphere, which container 10 is intended for the sputtering process of the invention. The The chamber 10 comprises a number of outlets 21 connected to each their vauum pump 17 and two inlets 19a and 19b respectively, for each their gas. Within the container 10 a cathode atomizing means 30 is arranged comprising a number of cathodes 13a, 13b connected to at least one energy source, at least one magnetrone 22 or the similar, and devices for carrying and feeding the receiving material 11, which is winded onto rolls 20 and 20b in the form of a band.

Vacuum is obtained by means of the vacuum pumps 17 decreasing the pressure in the pressure vessel 10 via the outlets 21 until the vacuum as desired has been obtained. The of receiving material 11 which preferably consists of aluminum sheet, but can consist of copper, nickel, or chromium as well, is divided into a number of, e.g., five rolls, for each batch of treatment which rolls are stored in a carriage 24 being movable into the container 10 from an openable end 25 of the container. Inside the pressure container 10 clutches 26a and 26b are connected to a driving and braking means 28, and 27, respectively, which via the clutches 26a, and 26b, connect the rolls 20a and 20b of the receiving material. The receiving material 11 is rolled off from the roll 20a, is treated in the treatment zone 16, and is rolled onto the roll 20b.

The cathode atomizing means 30 is insertable into the container via a channel 29 arranged transversally to the pressure container 10, so that the means is situated in the treatment zone 16. The atomizing means 30 comprises the cathodes 13a and 13b consisting essentially of nickel (Ni) and two magnetrones 22 situated in a short distance from the receiving material 11.

When the carriage 24 with the rolls 20a and 20b placed thereon is situated in the container 10 and this has been sealed and the pressure as desired has been obtained the cathodes 13a and 13b are connected to the energy source 18, while the receiving material 11 is rolled off from the roll 20a to the roll 20b, whereby it passes the treatment zone 16. The cathodes 13 are, in accordance with the present example, cylindrically shaped and are rotating. There is a possibility of lowering the cathodes successively during the ongoing process so that the material dedepositing rate shall become as even as possible. Simultaneously, a gas mixture consisting of a rare gas, e.g., argon (Ar) and a reactive gas, e.g., (O), is added via the lines 19a and 19b, respectively.

By means of the potential difference between the cathodes 13, and the receiving material 11 the gas become charged between these and forms a plasma gas. The ion activity of the plasma gas contributes to the fact that the ions of the plasma collide with nickel atoms on the cathode, whereby Ni-atoms are shoot out from the cathode surfaces and are attached to the receiving material. The concentration or amount of oxygen is chosen in such a way that the nickel layer deposed on the receiving material partly oxidizes during the deposition. In such a way a layer is obtained having a grain mixture of metallic nickel and nickel oxide.

The thickness of the layer is about 0.16 micrometer. In order to obtain a high absorption of the solar radiation a larger amount of metallic nickel should be present closest to the receiving material in order that then successively decrease to almost zero at the surface. This task is solved at a movable receiving material in such a way that more oxygen gas is added at the end of the coating zone than at the beginning thereof. By placing the gas nozzle 23 of the reactive gas at the outlet end of the coating zone and having it turned to form an angle obliquely towards this, a more thorough oxidation is obtained at the end of the treatment zone compared with the beginning of the zone. This means that the ratio of metallic nickel is 40 to 80%, preferably 50% closest to the receiving material. The surface layer of the coating consists essentially of oxidized particles.

The metal oxide (NiO) has a relatively high refraction index, and thus about 7% of incoming solar radiation is reflected. In order to be able to reduce reflexion losses the surface is coated with a further layer where the oxygen of the plasma has been mixed with a gas, e.g., flourine (F) which forms an oxiflouride (NiOF) having a lower refraction index. The thickness of this layer is about 0.05 micrometer. By means of this step the reflexion losses are reduced to about 2% for a totally smooth surface.

The embodiment shown in FIGS. 3 to 6 differs from the preceding one as the off and on rolling rolls 20a and 20b, respectively, are placed side by side on the same shaft 35, whereby a more compact design of the pressure container 10 can be obtained.

The track from the off rolling roll 20a to the on rolling roll 20b is determined by a number of pulleys 34a–34d. The receiving material 11 is rolled off from the roll 20a and is conveyed over a first lower pulley 34a, via a second pulley 34b, which with regard to the centre axis of the first pulley 34a is oblique (alpha=9°), whereupon the material is led over a second upper oblique pulley 34c and a second lower pulley 34d to the on rolling roll 20b. The axis 35 can be connected to a driving means (not shown) via a clutch device 26a. The part of the shaft onto which the on rolling roll 20b is mounted is arranged being driving while the second part onto which the roll 20a is mounted can roll freely, but its rotational speed can be regulated by means of brakes (not shown). The shaft 35, the pulleys 34 and their supporting frame is mounted on a carriage 24 which can be moved in and out from the container 10.

Figure 4:
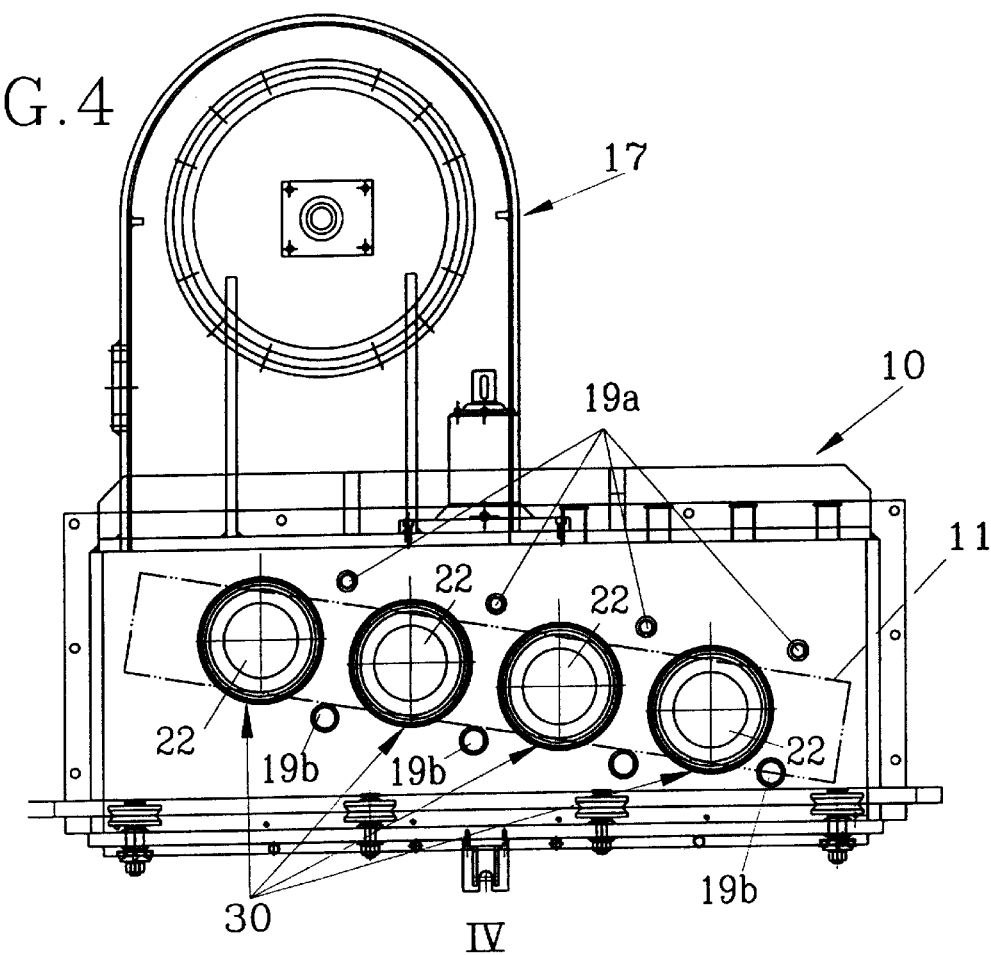

FIG. 4, which shows a cross-section along the line IV—IV through the container 10, shows how the cathode atomizing devices 30 are arrnaged over the track the receiving material 11 passes between the oblique pulleys 34b and 34c. At each cathode atomizing device 30 there is at least one inlet 19a arranged for the addition of a rare gas (e.g., argon) and an inlet 19b for the reactive gas (e.g., oxygen). The container communicates with a vacuum pump 17, which is used to empty the container of air and to obtain a controlled atmosphere. By arranging a number of cathode atomizing devices 30 after each other, the thickness of the oxide layer can be built up, if so wanted, and possibly, several different layers can be applied.

The sputtering is preferably carried out in two steps, viz. A first step where the reactive gas is added in a rear end of the treatment zone seen in a transporting direction of the receiving material and in a second step in which reactive gas is added from the opposite direction in the beginning and at the end of the treatment zone. In order to reach an absorption of 96 to 97% an anti reflexion layer (AR-layer) can be applied in step two above the metal oxide, which anti reflexion layer is formed by adding fluorine gas to the reactive gas—oxygen gas. The reflexion is reduced in this way over the total solar wavelength range thanks to the lower refraction index of the metal fluoride compared to that of the metal oxide.

Figure 5:
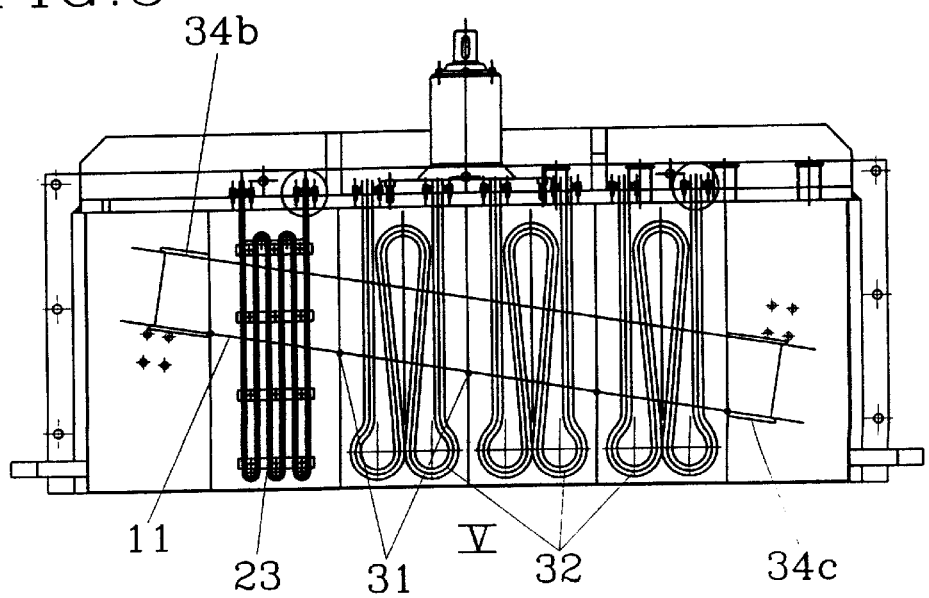

In the plant according to FIG. 5 heating devices 23 are shown in the form of heating helixes which when needed heat the receiving material 11 when it passes them, as well as cooling devices 32 for cooling the receiving material. The heating 23 and cooling 32 devices have turned out to be superfluous in the operations shown in examples I and II.

When using other metals, receiving materials, and gases they may, however, become necessary, to control the (surface) temperature of the receiving material 11. Between each heating and cooling device there is arranged heat sensitive sensors 31 which read the temperature of the receiving material and transmit data to a controlling unit (not shown) which controls the heating helixes and the cooling devices to maintain the correct temperature of the receiving material.

The graph 33 of FIG. 7 shows the relation between the cathode voltage and the oxygen concentration. The most the sputtering process. Before the oxygen gas is added only nickel is sputtered from the c a essential part of the graph is between the points A and D which determine the critical part of thode towards the receiving material 11. Between the points B and C when the concentration of oxygen is optimal, some nickel particles react with the oxygen gas whereby a porous oxide matrix having embedded Ni-particles therein is formed, which particles cover the bottom layer of the receiving material. Between points C and D the formation of the oxide layer takes place.

In order to reduce the soft magnetic properties of the nickel material it will be suitable to use a nickel-chromium-alloy having 4 to 30% of chromium, preferably 20%, as cathodes. Also other metals other than nickel and chromium can be used, viz. E.g., cobalt or molybdenum, but with retard to costs, nickel will be preferred.

EXAMPLE I

The example relates to a layer on a movable receiving material, addition of the reactive gas at the end of the coating zone, and a stationary cathode.

In the container 10 a pressure of $3 \times 10^{-3}$ millibar is obtained. The added effect from the energy source 18 is 7.5 kW, whereby a voltage of 600 V is obtained in the plasma gas. The flow of argon (Ar) was restricted to 400 cm$^3$/min while the oxygen gas flow was 52 cm$^3$/min. The distance between the cathode and the receiving material was 10 cm. A nickel oxide layer Ni+NiO having the thickness of 160 micrometer was formed on the surface of the receiving material consisting of aluminum (Al). The absorption area of said oxide thickness turned out to have a high—91%—solar radiation absorption and a low thermal emission—10%. The band speed was 1.5 m/min, not preheating. The magnetron gave a temperature of about 300° C. in the coating zone. The cathode had a diameter of 15 cm.

The process parameters according to this experiment were varied in accordance with the below given:

The treatment was carried at a pressure of between $1 \times 10^{-4}$ Torr and $5 \times 10^{-5}$ Torr, an added effect of between 100 W and 1 kW, an inflow of argon (Ar) of between 1.0 cm$^3$/min and 20.0 cm$^3$/min and a temperature of between 200° C. and 500° C.

EXAMPLE II

The surface of Example I was coated with a further coating in a second step in accordance with the following:

Pressure: 3 to 10-3 millibar

Magnetron effect: 4 kW

Voltage: 300 V

Oxygen gas: 80 cm$^3$/min and 60 cm$^3$/min

Tetrafluoro methane (CF$_4$): evenly distributed in the plasma

Speed: 1.15 m/min

The absorption having this further layer turned out to 96% of absorption and 10% of emission.

The above parameters are specific for this particular experiment and can be varied considerably with regard to the size of the container, the rolling speed of the receiving material etc.

LIST OF REFERENCE NUMBERS

| | |
|---|---|
| 10 | Pressure container |
| 11 | Receiving material |
| 13a, b | Cathode |
| 14 | Absorption surface |
| 16 | Treatment zone |
| 17 | Vacuum pump |
| 18 | Energy source |
| 19a, b | Inlets |
| 20a, b | Rolls |
| 21 | Outlets |
| 22 | Magnetron |
| 23 | Heating device |
| 24 | Carriage |
| 25 | Opening |
| 26a, b | Clutches |
| 27 | Braking means |
| 28 | Driving means |
| 29 | Channel |
| 30 | Cathode atomizing device |
| 31 | Sensor |
| 32 | Cooling device |
| 33 | Graph |
| 34a–34d | Pulleys |
| 35 | Nozzle |

What is claimed is:

1. A process for manufacturing on a movable receiving material a spectral selective absorbing layer for solar collectors, the spectral selective absorbing layer having a high solar absorption ability and a low thermal emittance, the process comprising:

atomizing metal in a coating zone present in a chamber having a sputtering atmosphere, the atmosphere containing oxygen and at least one gas supporting the sputtering, whereby the atomized metal forms the cathode and the movable receiving material forms the anode, the anode and the cathode providing a difference in electrical potential and thereby a plasma gas, and depositing the atomized metal by sputtering on the movable receiving material, characterized by:

providing an amount of oxygen in the coating zone of between about 1 and 50 cm$^3$/min, kW to deposit a layer of the metal onto the movable receiving material, the amount of oxygen in the coating zone being selected to partly oxidize the deposited metal to provide a mixture of the metal and metal oxide wherein between about 40 and 80% of the metal is embedded into the metal oxide closest to the movable receiving material; and increasing the amount of oxygen at the end of the coating zone to decrease the amount of the metal embedded into the metal oxide to about zero at the surface of the layer, the metal atomized in the coating zone being selected from the group consisting of nickel, chromium, cobalt and molybdenum.

2. The process of claim 1, wherein the gas in the coating zone supporting the sputtering is argon.

3. The process of claim 1, wherein the amount of oxygen provided in the coating zone comprises about 10 cm$^3$/min, kW.

4. The process of claim 1, wherein the amount of oxygen provided in the coating zone is selected to provide about 50% of metal embedded into the metal oxide closest to the movable receiving material.

5. The process of claim 1, wherein the metal comprises a nickel-chromium alloy having a chromium ratio of between about 4 and 30% and a grain size less than about 0.005 micrometer.

6. The process of claim 5, wherein the ratio of chromium is about 20% and the grain size is about 0.001 micrometer.

7. The process of claim 1, wherein the total thickness of the spectral selective absorbing layer is chosen as a function of the wave length of the solar radiation, the wave length having a range of between about 0.3 and 4 micrometers.

8. The process of claim 7, wherein the spectral selective absorbing layer has a thickness of between about 0.12 and 0.2 micrometer.

9. The process of claim 7, wherein the spectral selective absorbing layer has a thickness of about 0.16 micrometer.

10. The process of claim 2, wherein the movable receiving material passes through a pressure container (10) having a controlled atmosphere of between about $1\times10^{-4}$ to about $10^{-2}$ mbar and at least a part (16) of the movable receiving material (11) is brought within an activity area before at least one sacrificing cathode (13) connected to an added effect of between about 5 and 100 W/cm² of cathode area, said sacrificing cathode (13) comprising nickel, said sacrificing cathode (13) being brought into cooperation with oxygen and argon gas in an amount between about 5 and 100 cm³/min, kW.

11. The process of claim 10, wherein the atmosphere in the container (10) is about $6\times10^{-3}$ mbar.

12. The process of claim 10, wherein the sacrificing cathode (13) is connected to an added effect of about 50 W/cm².

13. The process of claim 10, wherein the argon gas is in an amount of about 30 cm³/min, kW.

14. The process of claim 1, wherein the sputtering is carried out in two steps, a first step wherein the oxygen is added at the end of the treatment zone of the first step in a direction of transport of the movable receiving material, and a second step wherein the oxygen is added in a direction opposite to the direction of transport of the movable receiving material at least in the beginning of the treatment zone of the second step.

15. The process of claim 14, comprising applying a second layer onto the surface of the spectral selective absorbing layer in a second step, the second step comprising adding to the oxygen in the sputtering atmosphere a reactive gas to provide the metal oxide with a lower refraction index.

16. The process of claim 15, wherein the reactive gas added in the second step comprises fluorine gas.

17. The process of claim 15, wherein the reactive gas added in the second step comprises chlorine gas.

18. The process of claim 15, wherein the thickness of the second layer is chosen as a function of the wave length of the solar radiation, the wave length having a range of between 0.3 and 4 micrometers.

19. The process of claim 18, wherein the thickness of the second layer is between about 0.02 and 0.1 micrometer.

20. The process of claim 18, wherein the thickness of the second layer is about 0.05 micrometer.

21. A spectral selective absorbing layer for solar collectors, the spectral selective absorbing layer having a high solar absorption ability and a low thermal emittance, the layer being applied on a receiving material by atomizing metal in a coating zone in a chamber having a sputtering atmosphere, the atmosphere containing oxygen and at least one gas supporting the sputtering, whereby the atomized metal forms the cathode and the receiving material forms the anode, the anode and the cathode providing a difference in electrical potential and thereby a plasma gas, and depositing the atomized metal by sputtering on the receiving material, characterized in that:

the amount of oxygen in the coating zone is between about 1 and 50 cm³/min, kW to deposit a layer of the metal onto the receiving material, the amount of oxygen in the coating zone being selected to partly oxidize the deposited metal to provide a mixture of the metal and metal oxide wherein between about 40 and 80% of the metal is embedded into the metal oxide closest to the receiving material, and the amount of oxygen is increased at the end of the coating zone to decrease the amount of the metal embedded into the metal oxide to about zero at the surface of the layer, the metal atomized in the coating zone being selected from the group consisting of nickel, chromium, cobalt and molybdenum.

22. The layer of claim 21, wherein the gas in the coating zone supporting the sputtering is argon.

23. The layer of claim 21, wherein the amount of oxygen provided in the coating zone comprises about 10 cm³/min, kW.

24. The layer of claim 21, wherein the amount of oxygen provided in the coating zone is selected to provide about 50% of metal embedded into the metal oxide closest to the movable receiving material.

25. The layer of claim 21, wherein the metal comprises a nickel-chromium alloy having a chromium ratio of between about 4 and 30% and a grain size less than about 0.005 micrometer.

26. The layer of claim 25, wherein the ratio of chromium is about 20% and the grain size is about 0.001 micrometer.

27. The layer of claim 21, further comprising a second layer applied onto the surface of the spectral selective absorbing layer in a second step, the second step comprising adding to the oxygen in the sputtering atmosphere a reactive gas to provide the metal oxide with a lower refraction index.

28. The layer of claim 27, wherein the reactive gas added in the second step comprises fluorine gas.

29. The layer of claim 27, wherein the reactive gas added in the second step comprises chlorine gas.

* * * * *